(12) United States Patent
Seong et al.

(10) Patent No.: US 9,750,131 B2
(45) Date of Patent: Aug. 29, 2017

(54) TRANSPARENT CONDUCTIVE LAMINATE, TRANSPARENT ELECTRODE INCLUDING TRANSPARENT CONDUCTIVE LAMINATE, AND METHOD FOR MANUFACTURING TRANSPARENT CONDUCTIVE LAMINATE

(71) Applicant: LG CHEM, LTD., Seoul (KR)

(72) Inventors: Jiehyun Seong, Daejeon (KR); Jinmi Jung, Daejeon (KR); Yong Goo Son, Daejeon (KR); Seung Heon Lee, Daejeon (KR); Song Ho Jang, Daejeon (KR); Bu Gon Shin, Daejeon (KR); Ji Young Hwang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/774,593

(22) PCT Filed: Jul. 30, 2014

(86) PCT No.: PCT/KR2014/006978
§ 371 (c)(1),
(2) Date: Sep. 10, 2015

(87) PCT Pub. No.: WO2015/016598
PCT Pub. Date: Feb. 5, 2015

(65) Prior Publication Data
US 2016/0044777 A1    Feb. 11, 2016

(30) Foreign Application Priority Data

Aug. 1, 2013  (KR) .................. 10-2013-0091805

(51) Int. Cl.
*H05K 1/00* (2006.01)
*H05K 1/02* (2006.01)
*H01L 51/00* (2006.01)
*H01L 51/10* (2006.01)
*H01L 51/44* (2006.01)
(Continued)

(52) U.S. Cl.
CPC ....... *H05K 1/0274* (2013.01); *H01L 51/0023* (2013.01); *H01L 51/105* (2013.01); *H01L 51/442* (2013.01); *H01L 51/445* (2013.01); *H01L 51/5212* (2013.01); *H05K 1/0306* (2013.01); *H05K 1/09* (2013.01); *H05K 3/06* (2013.01); *H05K 2201/0108* (2013.01); *H05K 2201/0302* (2013.01); *H05K 2201/0326* (2013.01); *H05K 2201/0329* (2013.01); *H05K 2201/09681* (2013.01); *Y02E 10/549* (2013.01); *Y02P 70/521* (2015.11)

(58) Field of Classification Search
CPC  H05K 1/0274; H05K 1/0306; H01L 51/0023; H01L 51/105; H01L 51/442; H01L 51/445
USPC .................. 174/253, 250, 251, 255–258, 261
See application file for complete search history.

(56) References Cited

U.S. PATENT DOCUMENTS

| | | |
|---|---|---|
| 8,513,878 B2 | 8/2013 | Tokunaga et al. |
| 2009/0117342 A1 | 5/2009 | Lee et al. |
| 2013/0157022 A1 | 6/2013 | Kim et al. |

FOREIGN PATENT DOCUMENTS

| | | |
|---|---|---|
| JP | 1993-151840 A | 6/1993 |
| JP | 1996-271921 A | 10/1996 |

(Continued)

*Primary Examiner* — Tremesha S Willis
(74) *Attorney, Agent, or Firm* — Dentons US LLP (57) ABSTRACT

Provided are a transparent conductive laminate, a transparent electrode including the transparent conductive laminate, and a manufacturing method for the transparent conductive laminate.

18 Claims, 6 Drawing Sheets

(51) Int. Cl.
*H01L 51/52* (2006.01)
*H05K 1/03* (2006.01)
*H05K 1/09* (2006.01)
*H05K 3/06* (2006.01)

(56) References Cited

FOREIGN PATENT DOCUMENTS

| | | |
|---|---|---|
| JP | 1997-185078 A | 7/1997 |
| JP | 2012-142500 A | 7/2012 |
| KR | 0717258 B1 | 5/2007 |
| KR | 10-2009-0057060 A | 6/2009 |
| KR | 101050137 B1 | 7/2011 |
| KR | 20130068908 A | 6/2013 |
| WO | 2010-018733 A1 | 2/2010 |

TRANSPARENT CONDUCTIVE LAMINATE, TRANSPARENT ELECTRODE INCLUDING TRANSPARENT CONDUCTIVE LAMINATE, AND METHOD FOR MANUFACTURING TRANSPARENT CONDUCTIVE LAMINATE

CROSS-REFERENCE TO RELATED APPLICATIONS

This application is a National Stage Application of International Application No. PCT/KR2014/006978, filed Jul. 30, 2014, and claims priority to and the benefit of Korean Patent Application No. 10-2013-0091805, filed on Aug. 1, 2013, the contents of each which is incorporated by reference in its entirety for all purposes as if fully set forth below.

TECHNICAL FIELD

The present invention relates to a transparent conductive laminate, a transparent electrode including the transparent conductive laminate, and a manufacturing method of the transparent conductive laminate.

BACKGROUND ART

A transparent conductive laminate means a thin film having high transmittance of light and electricity, and has been widely used as a voltage applying type common electrode or a pixel electrode of a liquid crystal display, an electrochromic display (ECD), an organic electroluminescence device, a solar cell, a plasma display panel, a flexible display, an electronic paper, a touch panel, or the like.

It may be essential that materials of transparent conducting oxides (TCO) are designed so as to transmit light in a visible light area and have high conductivity. For transparence in the visible light area (wavelength of 400 to 700 nm), an electronic energy bandgap needs to be 3.1 eV or more, which is electromagnetic energy of a wavelength of 400 nm.

Oxide semiconductors satisfying such a characteristic are representatively ZnO (3.3 eV), $In_2O_3$ (3.7 eV), and $SnO_2$ (3.6 eV). In general, TCO has light transmittance of 80% or more in the visible light area and resistivity of about $10^{-4}$ Ωcm or less, as an electric property.

In order to find materials used in the TCO, researches of methods of performing doping, alloying, and the like on various materials have been conducted up to now. Particularly, in the case of $In_2O_3$, since $In_2O_3$ has lower resistivity than $SnO_2$ or ZnO, $In_2O_3$ was commercialized first, and $In_2O_3$ which has been still used today is ITO (Sn doped $In_2O_3$).

However, there is a problem in that a transparent conductive film made of a material such as ITO and ZnO has low conductivity. In order to solve the problem, for the purpose of improving conductivity, an attempt to form an auxiliary electrode formed by a metal pattern on a transparent conductive film electrode has been made, but a surface step and surface roughness are increased due to the auxiliary electrode, and as a result, there is a problem in that coating and the like as postprocessing are not smoothly performed.

BACKGROUND ART

Korean patent gazette: 10-1050137

SUMMARY OF THE INVENTION

The present invention has been made in an effort to provide a transparent conductive laminate, a transparent electrode including the transparent conductive laminate, and a manufacturing method for the transparent conductive laminate that can solve the problem.

An exemplary embodiment of the present invention provides a transparent conductive laminate including: a transparent substrate; two or more transparent conductive patterns provided on the transparent substrate; and a conductive line having higher electrical conductivity than the transparent conductive pattern, in which the conductive line and the transparent conductive pattern are provided on the same surface of the transparent substrate, and the conductive line is provided to contact at least a part of the transparent conductive pattern between at least two adjacent transparent conductive patterns.

Another exemplary embodiment of the present invention provides a transparent conductive laminate that further includes a transparent conductive layer provided on the upper surface of the transparent conductive pattern and the conductive line.

Yet another exemplary embodiment of the present invention provides a transparent electrode including the transparent conductive laminate.

Still another exemplary embodiment of the present invention provides a manufacturing method of a transparent conductive laminate including: preparing a transparent substrate; forming a first transparent conductive layer on the transparent substrate; patterning of forming two or more transparent conductive patterns by patterning the first transparent conductive layer; and forming a conductive line between at least two adjacent transparent conductive patterns so that at least a part of the conductive line contacts the transparent conductive pattern.

According to the exemplary embodiments, since the transparent conductive laminate has low sheet resistance, the transparent conductive laminate has an excellent effect as a transparent electrode.

Further, the transparent conductive laminate has an advantage of having a high aperture ratio and high transmittance of visible light.

Further, since the transparent conductive laminate has a very small surface step, in the case of forming another layer such as an organic material layer on the transparent conductive laminate as postprocessing, it is advantageous that an error rate may be significantly lowered.

Further, when the transparent electrode including the transparent conductive laminate is used in an electronic device, it is advantageous that a low error rate may be achieved and high efficiency is shown due to excellent electric conductivity.

DETAILED DESCRIPTION

Hereinafter, the present invention will be described in more detail.

The present invention provides a transparent conductive laminate including: a transparent substrate; two or more transparent conductive patterns provided on the transparent substrate; and a conductive line having higher electrical conductivity than the transparent conductive pattern, in which the conductive line and the transparent conductive pattern are provided on the same surface of the transparent substrate, and the conductive line is provided to contact at least a part of the transparent conductive pattern between at least two adjacent transparent conductive patterns.

Further, according to the exemplary embodiment of the present invention, the conductive line may be provided to contact the transparent conductive pattern between the transparent conductive patterns.

The "at least two adjacent transparent conductive patterns" may mean at least two transparent conductive patterns which are closest positioned among the transparent conductive patterns.

The "transparency" of the present invention means that transmittance of visible light is 50% or more or 60% or more. Further, the "transparency" may include a case where the entire area is not fully transparent and an aperture ratio is 60% or more.

The "conductivity" of the present invention means electrical conductivity.

The "conductive line" of the present invention means a straight line, a curved line, or a continuous line in which the straight line and the curved line are combined, which is made of a material having electrical conductivity. Further, the conductive line may include a branch point including a branch.

The "pattern" of the present invention may mean that a predetermined shape is repetitively formed. In detail, the pattern may be a polygon such as a triangle and a quadrangle, a circle, an oval, or an amorphous shape.

According to the exemplary embodiment of the present invention, the shape of the transparent conductive pattern may be a triangle, a quadrangle, a honeycomb shape, or a Voronoi polygon. In detail, the triangle may be an equilateral triangle, a right triangle, and the like, and the quadrangle may be a square, a rectangle, a trapezoid, and the like. The Voronoi polygon may be a shape of a pattern formed by a method of filling a region having the closest distance between each dot and the corresponding dot as compared with the distance from other dots, when dots called Voronoi diagram generators are disposed in a region to be filled.

According to the exemplary embodiment of the present invention, the conductive line may be provided to be filled between at least two adjacent transparent conductive patterns on the transparent substrate. In detail, at least two transparent conductive patterns are separated from each other, and may be physically and electrically connected to each other by the conductive line.

Further, according to the exemplary embodiment of the present invention, the conductive line may be provided to contact a side of the transparent conductive pattern. In detail, according to the exemplary embodiment of the present invention, the conductive line may be provided to contact the entire side of the transparent conductive pattern, or only a part of the conductive line may be provided to contact the side of the transparent conductive pattern.

Figure 1:
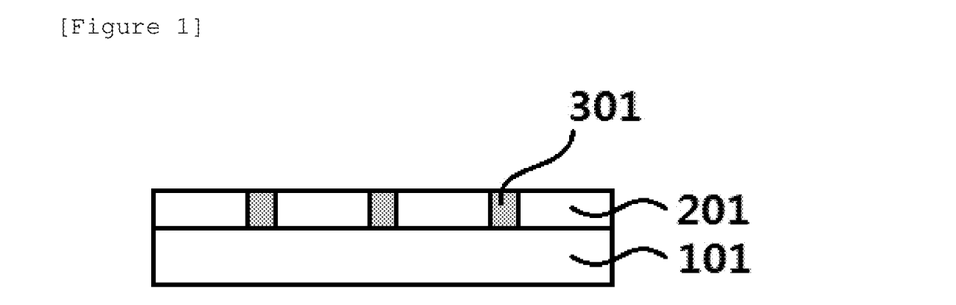
FIG. 1 illustrates a partial area of a side section of a transparent conductive laminate according to an exemplary embodiment of the present invention.

FIG. 1 illustrates a partial area of a side section of the transparent conductive laminate according to the exemplary embodiment of the present invention. In detail, FIG. 1 illustrates an example of a transparent conductive laminate including a conductive line 301 provided between transparent conductive patterns 201 on a transparent substrate 101.

Figure 2:
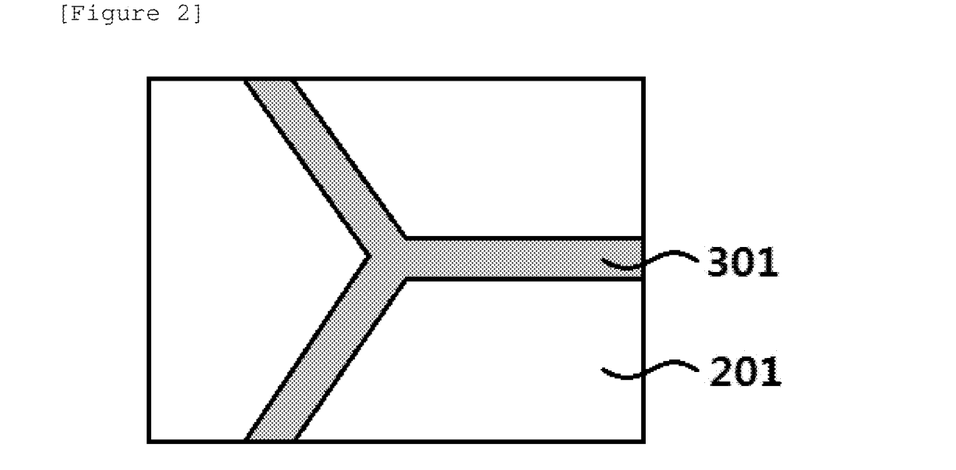
FIG. 2 illustrates a partial area of a top view of the transparent conductive laminate according to the exemplary embodiment of the present invention.

FIG. 2 illustrates a partial area of a top view of the transparent conductive laminate according to the exemplary embodiment of the present invention. In detail, FIG. 2 illustrates a partial area of an upper surface of the transparent conductive laminate according to the exemplary embodiment of the present invention, and illustrates the transparent conductive laminate including the conductive line 301 provided between the transparent conductive patterns 201.

According to the exemplary embodiment of the present invention, an upper surface step between the transparent conductive pattern and the conductive line which face a lower surface adjacent to the transparent substrate may be 0 nm or more and 30 nm or less.

According to the exemplary embodiment of the present invention, the transparent substrate is a glass substrate, and the thickness of the transparent conductive pattern may be 150 nm or more and 200 nm or less.

According to the exemplary embodiment of the present invention, the thickness of the transparent conductive pattern may be 150 nm or more and 200 nm or less, and the upper surface step between the transparent conductive pattern and the conductive line may be 0 nm or more and 30 nm or less.

According to the exemplary embodiment of the present invention, an upper surface step between the transparent conductive pattern and the conductive line which face a lower surface adjacent to the transparent substrate may be 0 nm or more and 10 nm or less.

According to the exemplary embodiment of the present invention, the transparent substrate is a plastic substrate, and the thickness of the transparent conductive pattern may be 15 nm or more and 20 nm or less.

According to the exemplary embodiment of the present invention, the thickness of the transparent conductive pattern may be 15 nm or more and 20 nm or less, and the upper surface step between the transparent conductive pattern and the conductive line may be 0 nm or more and 10 nm or less.

The "the lower surface adjacent to the transparent substrate" means a surface of the transparent conductive pattern and the conductive line which is positioned to be closest to the transparent substrate.

The "surface step" of the present invention may mean a flat degree of an upper boundary of at least two transparent conductive patterns and the conductive line provided on the transparent substrate. That is, the "surface step" may mean a flat degree of the upper surface of the transparent conductive laminate of the present invention.

In the transparent conductive laminate of the present invention, the upper surface step is very low. Further, the transparent conductive laminate of the present invention has an advantage of having low roughness of the upper surface. Therefore, in the case of forming an additional layer on the transparent conductive laminate of the present invention, it is advantageous that a layer having a predetermined thickness may be formed. Therefore, in the case of forming an electronic device by using the transparent conductive laminate of the present invention, it is advantageous that an error rate may be lowered. That is, in the case of coating and laminating another material on the transparent conductive laminate of the present invention, it is possible to prevent a problem such as dewetting, disconnecting, and bubble trap. Furthermore, when the additional layer is deposited on the transparent conductive laminate of the present invention, step coverage is excellent, and a void may be prevented from being generated.

When the transparent conductive film in which ITO, IZO, and the like are formed on the transparent substrate as the entire layer is applied to the electronic device due to the high sheet resistance, there is a problem in that efficiency is low. Therefore, the inventors have made an attempt to lower the sheet resistance of the transparent conductive film by forming an auxiliary electrode having a minute line width on the transparent conductive film. However, the inventors observe that the error rate such as the disconnection occurring when forming the additional layer on the transparent conducive film is high due to the surface step by the auxiliary electrode. Furthermore, in order to lower the error rate, the inventors make the attempt to lower a tapered angle of the auxiliary electrode, but observe that it is difficult to implement the minute line width.

Further, in order to prevent the auxiliary electrode from being short-circuited by contacting the organic material layer or an opposing electrode, in case of forming an insulating film on the surface of the auxiliary electrode, there is a problem in that an aperture ratio of the transparent conductive layer is lowered.

Therefore, in order to solve the problem, the inventors have developed the transparent conductive laminate having a low surface step of the present invention.

According to the exemplary embodiment of the present invention, the thickness of the transparent conductive pattern may be 15 nm or more and 200 nm or less. Further, according to the exemplary embodiment of the present invention, the thickness of the transparent conductive pattern may be 50 nm or more and 180 nm or less.

According to the exemplary embodiment of the present invention, in the case where the transparent substrate is a substrate having high heat resistance such as a glass substrate, the thickness of the transparent conductive pattern may be 100 nm or more and 200 nm or less, or 150 nm or more and 180 nm or less.

According to the exemplary embodiment of the present invention, in the case where the transparent substrate is a substrate having low heat resistance such as a plastic substrate, the thickness of the transparent conductive pattern may be 15 nm or more and 20 nm or less.

When the thickness of the transparent conductive pattern is within the range, it is possible to implement excellent light transmittance and excellent electrical conductivity.

According to the exemplary embodiment of the present invention, the line width of the conductive line may be 2 μm or more and 70 μm or less.

In the transparent conductive laminate of the present invention, since the conductive line may be implemented with a minute line width, there is an advantage in that the aperture ratio of the transparent conductive laminate may be increased. In detail, in the conductive line, the minute line width may be implemented by a manufacturing method of the transparent conductive laminate to be described below.

The "line width of the conductive line" of the present invention is a distance in a direction which is vertical to a thickness direction of the conductive line. In detail, the "line width of the conductive line" may be a separation distance between the adjacent transparent conductive patterns.

According to the exemplary embodiment of the present invention, a pitch of the transparent conductive pattern may be 100 μm or more and 600 μm or less.

The "pitch of the transparent conductive pattern" of the present invention may mean a minimum distance at which the two or more transparent conductive patterns are repeated. That is, the "pitch of the transparent conductive pattern" may mean a distance when the centers of the adjacent transparent conductive patterns are connected to each other.

According to the exemplary embodiment of the present invention, the transparent substrate may be a glass substrate or a transparent plastic substrate having excellent transparency, surface smoothness, ease of handling, and water resistance, but is not limited thereto, and is not limited if the transparent substrate is a substrate which is generally used in an organic electronic device.

According to the exemplary embodiment of the present invention, the transparent conductive pattern may include metal oxide or a transparent conductive polymer. In detail, according to the exemplary embodiment of the present invention, the transparent conductive pattern may include transparent conductive oxide.

According to the exemplary embodiment of the present invention, the metal oxide may include one or more kinds selected from a group consisting of indium tin oxide (ITO), indium zinc oxide (IZO), indium gallium zinc oxide (IGZO), AZO (Al-doped ZnO), GZO (Ga-doped ZnO), $SnO_2$, and ZnO. However, the metal oxide is not limited thereto, and may not be limited if the metal oxide is a material which is transparent and has excellent electrical conductivity.

According to the exemplary embodiment of the present invention, the transparent conductive polymer may be poly (3,4-ethylenedioxythiophene (PEDOT) and/or poly(3,4-ethylenedioxythiophene)-poly(styrenesulfonate) (PEDOT: PSS). Further, according to the exemplary embodiment of the present invention, the transparent conductive polymer may include a conductive nano material such as a metal nanowire and carbon nano tube in a polymer matrix.

However, the transparent conductive polymer is not limited thereto, and may not be limited if the metal oxide is a material which is transparent and has excellent electrical conductivity.

According to the exemplary embodiment of the present invention, the material of the transparent conductive pattern may be the same as the material of a transparent conductive layer to be described below.

Even though the line width of the conductive line is small, the material of the transparent conductive pattern may be metal having higher electrical conductivity in order to obtain high conductivity. In detail, according to the exemplary embodiment of the present invention, the conductive line may include one or more kinds selected from a group consisting of silver, copper, aluminum, gold, nickel, bismuth, palladium, or an alloy thereof. However, the material of the transparent conductive pattern is not limited thereto, and may not be limited if the material of the transparent conductive pattern is a material which has higher electrical conductivity than the conductive pattern.

According to the exemplary embodiment of the present invention, the sheet resistance of the transparent conductive laminate may be 70% or less of the sheet resistance of the transparent conductive pattern. In detail, according to the exemplary embodiment of the present invention, the sheet resistance of the transparent conductive laminate may be 30% or more and 70% or less of the sheet resistance of the transparent conductive pattern. Further, the sheet resistance of the transparent conductive laminate may be 40% or more and 70% or less of the sheet resistance of the transparent conductive pattern.

In the transparent conductive laminate of the present invention, the sheet resistance of the entire transparent conductive laminate may be lowered due to a low resistance value of the conductive line. That is, when the transparent conductive laminate of the present invention is applied to the electronic device, high efficiency may be implemented due to a relatively low sheet resistance.

According to the exemplary embodiment of the present invention, the aperture ratio of the transparent conductive laminate may be 80% or more and 99% or less. That is, since the conductive line having the minute line width may be formed, the transparent conductive laminate of the present invention may have a high aperture ratio.

The "aperture ratio of the transparent conductive laminate" of the present invention may mean a percentage value of the sum of the transparent conductive pattern areas to the entire area of the transparent conductive laminate.

According to the exemplary embodiment of the present invention, the transmittance of the visible light of the transparent conductive laminate may be 60% or more and 93% or less. In detail, according to the exemplary embodiment of the present invention, the transmittance of the visible light of the transparent conductive laminate may be 70% or more and 90% or less.

The "transmittance of the visible light of the transparent conductive laminate" of the present invention may be transmittance for visible light of the transparent conductive pattern. According to the exemplary embodiment of the present invention, the conductive line has high electrical conductivity, but may be an opaque material, and as a result, the transmittance for visible light may be the transmittance for visible light of the transparent conductive pattern.

According to the exemplary embodiment of the present invention, a transparent conductive layer provided on the upper surface of the transparent conductive pattern and the conductive line may be further included.

The transparent conductive layer is provided on the transparent conductive laminate to serve to decrease the upper surface step. Further, the transparent conductive layer may alleviate a problem that performance such as electrical conductivity of the transparent conductive laminate may be nonuniform due to a foreign property between the conductive line and the transparent conductive pattern. Further, even though a minute gap is present between the conductive line and the transparent conductive pattern, there is an advantage in that the transparent conductive layer may compensate for the gap.

Figure 3:
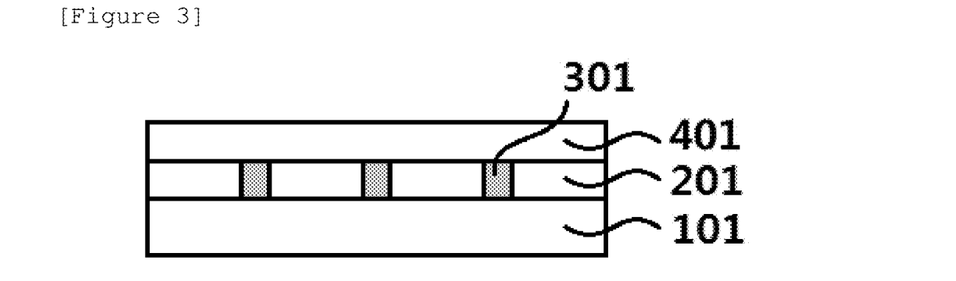
FIG. 3 illustrates a partial area of a side section of the transparent conductive laminate according to the exemplary embodiment of the present invention.

FIG. 3 illustrates a partial area of a side section of the transparent conductive laminate according to the exemplary embodiment of the present invention. In detail, FIG. 3 illustrates an example of a transparent conductive laminate in which a transparent conductive pattern 201 and a conductive line 301 between the transparent conductive patterns 201 are included on a transparent substrate 101, and a transparent conductive layer 401 is provided on the transparent conductive pattern 201 and the conductive line 301.

According to the exemplary embodiment of the present invention, the thickness of the transparent conductive layer may be 50 nm or more and 180 nm or less.

According to the exemplary embodiment of the present invention, the transparent conductive layer may include one or more kinds selected from a group consisting of a metal oxide, a transparent conductive polymer, carbon nanotube, graphene, and a metallic nanowire.

According to the exemplary embodiment of the present invention, the material of the transparent conductive layer may be the same as the material of a transparent conductive pattern.

The present invention provides a transparent electrode including the transparent conductive laminate.

Further, the present invention provides an organic electronic device including the transparent electrode.

According to the exemplary embodiment of the present invention, the transparent electrode may be an anode.

According to the exemplary embodiment of the present invention, the organic electronic device may be one selected from a group consisting of an organic solar cell, an organic light emitting device, an organic transistor, and an organic photoconductor.

According to the exemplary embodiment of the present invention, the organic solar cell may include at least one organic material layer including an anode, a cathode provided to face the anode, and a photoactive layer provided between the anode and the cathode.

According to the exemplary embodiment of the present invention, the organic light emitting device may include at least one organic material layer including an anode, a cathode provided to face the anode, and a light emitting layer provided between the anode and the cathode.

According to the exemplary embodiment of the present invention, the organic transistor may include a source, a drain, a gate, and at least one organic material layer. In the case of the organic transistor, the transparent conductive laminate may be a source or a drain.

According to the exemplary embodiment of the present invention, the organic photoconductor may include at least one organic material layer including an anode, a cathode provided to face the anode, and an organic photosensitive layer provided between the anode and the cathode.

The present invention provides a manufacturing method of a transparent conductive laminate including: preparing a transparent substrate; forming a first transparent conductive layer on the transparent substrate; patterning of forming two or more transparent conductive patterns by patterning the first transparent conductive layer; and forming a conductive line between at least two adjacent transparent conductive patterns so that at least a part of the conductive line contacts the transparent conductive pattern.

According to the exemplary embodiment of the present invention, the first transparent conductive layer may be formed by using the material of the transparent conductive pattern.

According to the exemplary embodiment of the present invention, the first transparent conductive layer may be formed on the transparent substrate by depositing, a solution process, or a transfer process. However, the method is not limited thereto, and may be used without limitation if the method is a method by which the first transparent conductive layer may be formed at a predetermined thickness.

According to the exemplary embodiment of the present invention, the conductive line may be formed by using the material of the conductive line described above.

According to the exemplary embodiment of the present invention, the forming of the conductive line may be forming a conductive layer for forming the conductive line on the transparent substrate and the transparent conductive pattern and removing the conductive layer formed on the transparent conductive pattern, after the patterning.

According to the exemplary embodiment of the present invention, the conductive layer may be formed with a thickness of 0 nm or more and 30 nm or less as a difference from the thickness of the transparent conductive pattern.

The thickness of the conductive layer may mean a length from the upper surface of the transparent substrate where the transparent conductive pattern is not formed to the upper surface of the conductive layer.

According to the exemplary embodiment of the present invention, the thickness of the conductive layer may be larger than the thickness of the transparent conductive pattern. In detail, according to the exemplary embodiment of the present invention, the thickness of the conductive layer is larger than the thickness of the transparent conductive pattern, and a value obtained by subtracting the thickness of the transparent conductive pattern layer from the thickness of the conductive layer may be 0 nm or more and 30 nm or less.

According to the exemplary embodiment of the present invention, the thickness of the conductive layer may be smaller than the thickness of the transparent conductive pattern. In detail, according to the exemplary embodiment of the present invention, the thickness of the conductive layer is smaller than the thickness of the transparent conductive pattern, and a value obtained by subtracting the thickness of the conductive layer from the thickness of the transparent conductive pattern layer may be 0 nm or more and 30 nm or less.

Furthermore, according to the exemplary embodiment of the present invention, the transparent conductive laminate having a small surface step may be manufactured by removing the conductive layer without forming the conductive line.

According to the exemplary embodiment of the present invention, the forming of the conductive layer may be performed by inkjet printing or sintering after fully coating the surface by using a metal nanoparticle ink and/or an organic metal ink.

In detail, in the case of forming the conductive layer, the conductive line is formed between the transparent conductive patterns. Furthermore, the transparent conductive laminate may be manufactured by removing the conductive layer without forming the conductive line formed on the transparent conductive pattern.

Further, according to the exemplary embodiment of the present invention, a sacrificial layer may be formed on the transparent conductive layer before forming the conductive layer. In this case, the transparent conductive laminate may be manufactured by forming the conductive line by forming the conductive layer after patterning the transparent conductive layer and removing the conductive layer without forming the conductive line together with the sacrificial layer. The sacrificial layer of the present invention may serve to easily remove the conductive layer without forming the conductive line.

Further, according to the exemplary embodiment of the present invention, in the forming of the conductive layer, the conductive layer may be formed by a method such as sputtering, thermal depositing, electron-beam depositing, and chemical vapor depositing by using the material of the conductive line such as metal.

Further, according to the exemplary embodiment of the present invention, the forming of the conductive layer, the conductive layer may be formed by a method such as silver mirror reaction and other electroless plating or electrolytic plating.

According to the exemplary embodiment of the present invention, in the case of forming the conductive layer by the electroless plating or electrolytic plating method, a seed layer is first formed and then the conductive layer may be formed.

According to the exemplary embodiment of the present invention, the method may further include forming a sacrificial layer on the first transparent conductive layer; patterning simultaneously or respectively the first transparent conductive layer and the sacrificial layer; and removing the sacrificial layer after forming the conductive line.

According to the exemplary embodiment of the present invention, the sacrificial layer may use a polymer solution, a negative photoresist, a positive photoresist, a UV-curable oligomer, a UV-curable resin, a molybdenum oxide, and the like, and may use any material that may not peel during a process of forming the conductive layer on the sacrificial layer after forming the sacrificial layer and may simply remove the sacrificial layer without damaging the conductive layer and the conductive line even after the conductive layer is formed.

According to the exemplary embodiment of the present invention, a method of forming the sacrificial layer may use a method such as coating, transfer, and depositing.

According to the exemplary embodiment of the present invention, in the removing of the sacrificial layer, any method that may remove the sacrificial layer while the damage to the conductive line and the first transparent conductive layer is small may be used without limitation. In detail, according to the exemplary embodiment of the present invention, the sacrificial layer may be removed by using a solvent that may dissolve the sacrificial layer well or a dedicated stripping solution. In more detail, according to the exemplary embodiment of the present invention, in the case where the sacrificial layer is made of a polymer, the sacrificial layer may be removed by using ethanol, acetone, N-Methylpyrrolidone (NMP), or dimethylformamide (DMF) as a solvent that may dissolve the polymer well and/or an organic amine-based stripping solution. Further, according to the exemplary embodiment of the present invention, in the case where a material constituting the sacrificial layer is a material that may be dissolved in a basic solution, the sacrificial layer may be removed by using a basic aqueous solution. Further, according to the exemplary embodiment of the present invention, in the case where a material constituting the sacrificial layer is a material that may be dissolved in water, the sacrificial layer may be removed by using distilled water.

According to the exemplary embodiment of the present invention, in the case of using the sacrificial layer, after the sacrificial layer is formed on the first transparent conductive layer, the first transparent conductive layer may be patterned.

According to the exemplary embodiment of the present invention, in the patterning, the first transparent conductive layer and the sacrificial layer may be simultaneously patterned. In detail, according to the exemplary embodiment of the present invention, in the case where the first transparent conductive layer is patterned by using laser etching, the first transparent conductive layer and the sacrificial layer may be simultaneously etched by a laser, and as a result, separately etching the sacrificial layer may be omitted.

According to the exemplary embodiment of the present invention, in the patterning, the first transparent conductive layer and the sacrificial layer may be respectively patterned. In detail, according to the exemplary embodiment of the present invention, the sacrificial layer may be patterned by using wet etching, dry etching, laser etching, a photolithographic method, a printing method, and the like. Furthermore, the first transparent conductive layer may be patterned in the same as the pattern of the sacrificial layer patterned by using dry etching, wet etching, laser etching, and the like.

According to the exemplary embodiment of the present invention, the manufacturing method of the transparent conductive laminate may further include forming a second transparent conductive layer after forming the conductive line.

According to the exemplary embodiment of the present invention, the second transparent conductive layer may be formed by a coating method, a depositing method, a transfer method, and the like by using the material of forming the transparent conductive pattern described above.

Figure 4:
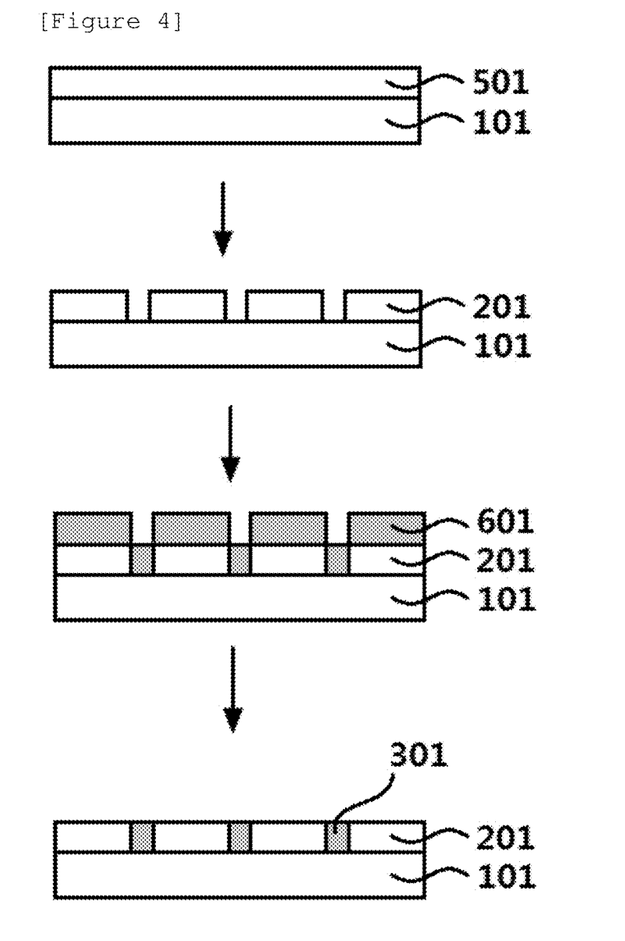
FIGS. 4 to 6 illustrate a manufacturing method of a transparent conductive laminate according to another exemplary embodiment of the present invention.
Figure 5:
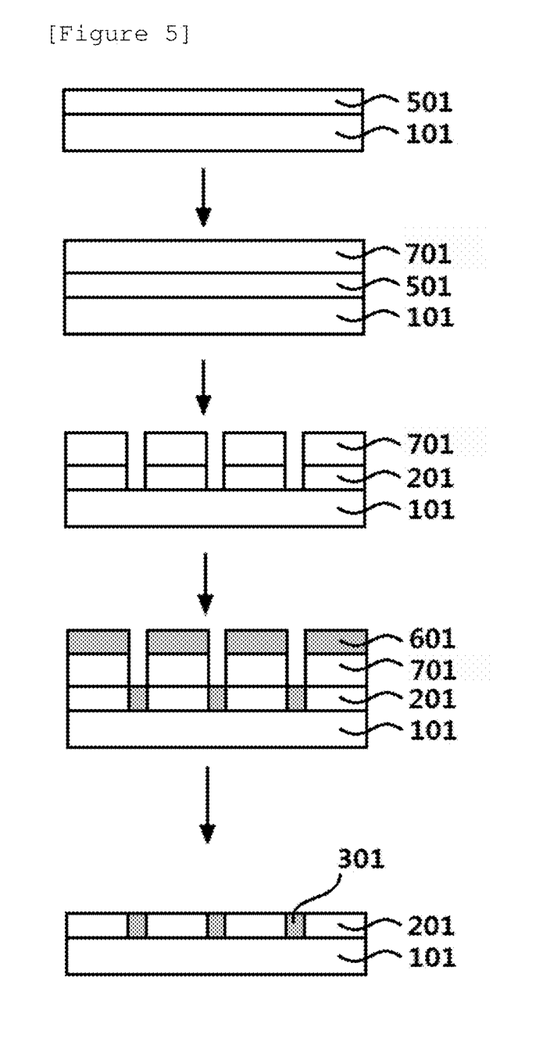
Figure 6:
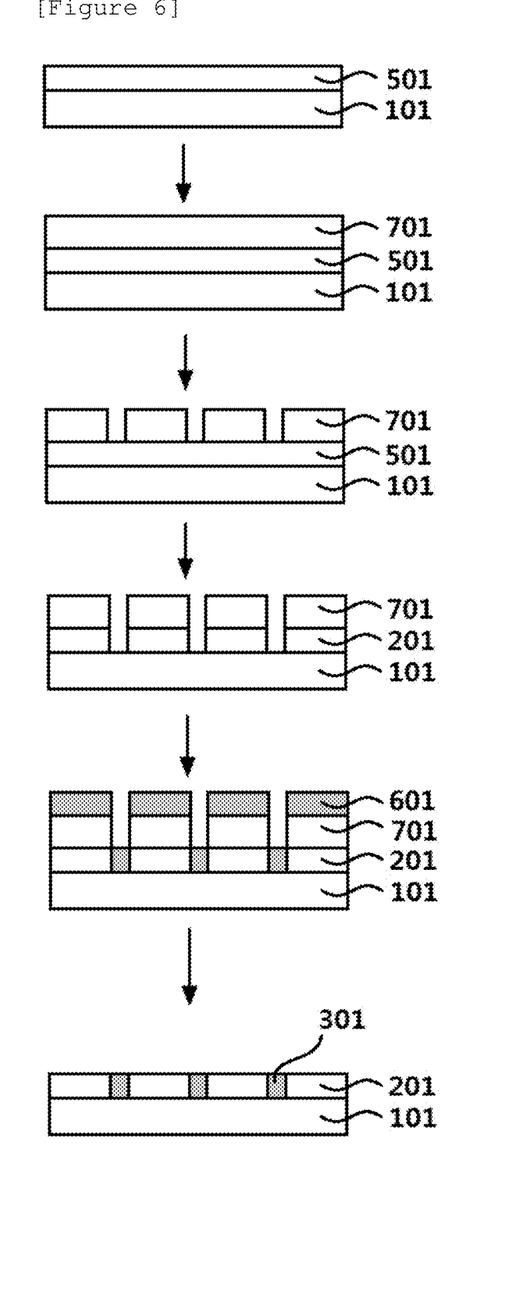

FIGS. 4 to 6 illustrate a manufacturing method of a transparent conductive laminate according to another exemplary embodiment of the present invention.

In FIG. 4, a first transparent conductive layer 501 is formed on a transparent substrate 101, and a transparent conductive pattern 201 is formed by patterning the first transparent conductive layer 501. Thereafter, after forming the conductive layer 601, the transparent conductive laminate is manufactured by removing the conductive layer without forming a conductive line 301.

In FIG. 5, the first transparent conductive layer 501 is formed on the transparent substrate 101, and after forming a sacrificial layer 701 on the first transparent conductive layer, the transparent conductive pattern 201 is formed by simultaneously etching the first transparent conductive layer 501 and the sacrificial layer 701. Thereafter, after forming the conductive layer 601, the transparent conductive laminate is manufactured by removing the conductive layer without forming the conductive line 301 and the sacrificial layer 701.

In FIG. 6, the first transparent conductive layer 501 is formed on the transparent substrate 101, and after forming a sacrificial layer 701 on the first transparent conductive layer, the sacrificial layer 701 is patterned, and thereafter, the transparent conductive pattern 201 is formed by patterning the first transparent conductive layer 501. Thereafter, after forming the conductive layer 601, the transparent conductive laminate is manufactured by removing the conductive layer without forming the conductive line 301 and the sacrificial layer 701.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

Comparative Example 1

ITO was formed on a glass substrate with a thickness of 170 nm to manufacture a transparent conductive laminate. In the transparent conductive laminate, ITO was a crystalline state, and a sheet resistance of the transparent conductive laminate was 10 $\Omega$/sq to 11 $\Omega$/sq.

Example 1

ITO was formed on a glass substrate with a thickness of 170 nm. After ultra-1 300 (Daw Chemical) which was a photoresist was formed on the ITO with a thickness of about 100 nm by using a spin coating method, a square pattern of ITO was formed by etching a resist layer and an ITO layer in a square mesh form with a line width of 25 μm and a pitch of 438 μm by using a UV laser (Hanbit Laser Corporation). Thereafter, the substrate was immersed in an aluminum precursor solution for 2 minutes at a temperature of 90° C. after coating an organic titanium-based catalyst solution to form an aluminum conductive layer. Thereafter, the substrate was immersed in acetone for 30 minutes to remove the photoresist layer and the aluminum conductive layer formed thereon, and the transparent conductive laminate constituted by the transparent conductive pattern of ITO and the conductive line of aluminum was manufactured.

It was verified that the sheet resistance of the transparent conductive laminate manufactured in Example 1 was 6.7 $\Omega$/sq, and 61% to 67% of the sheet resistance of the glass substrate made of only ITO manufactured in Comparative Example 1. That is, it can be seen that electric conductivity of the transparent conductive laminate manufactured in Example 1 is higher than that of a film made of only ITO.

Figure 7:
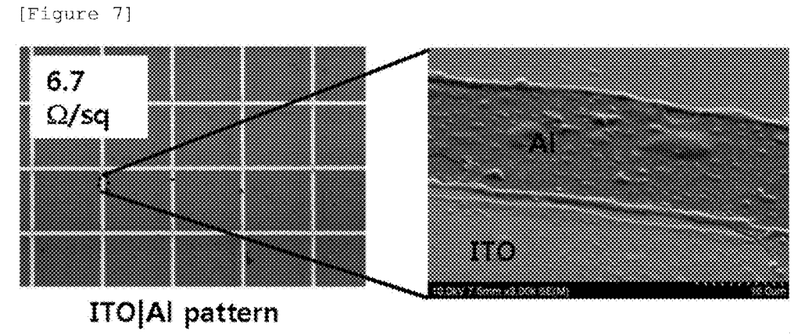
FIG. 7 illustrates a photograph of a transparent conductive laminate according to Example 1.

FIG. 7 illustrates a photograph of a transparent conductive laminate according to Example 1.

Comparative Example 2

Amorphous ITO was formed on a glass substrate by sputtering with a thickness of 170 nm at room temperature to manufacture a transparent conductive laminate. In the transparent conductive laminate, ITO was an amorphous state, and a sheet resistance of the transparent conductive laminate was 100 $\Omega$/sq.

Example 2

Amorphous ITO was formed on a glass substrate by sputtering with a thickness of 170 nm at room temperature. LGPR-412DR(LG CHEM.) which was a novalic-based photoresist was formed on the ITO with a thickness of 1.7 μm, and then a honeycomb (hexagonal) photoresist pattern was formed by a photolithography process. Thereafter, after the substrate was immersed in a 3% oxalic acid solution, ITO of an exposed portion which is not covered by the photoresist was removed by stirring the oxalic acid solution for 20 minutes at a temperature of 40° C. Thereafter, after a copper conductive layer having a thickness of 170 nm was formed by electron-beam deposition and then immersed in a dedicated stripping solution of an organic amine-based photoresist for 10 minutes to remove the photoresist and the copper conductive layer formed thereon. Thereafter, the transparent conductive laminate constituted by a transparent conductive pattern made of ITO and a conductive line made of copper was manufactured.

The line width of the conductive line of the transparent conductive laminate manufactured in Example 2 was 9 μm, and the transparent conductive pattern was a honeycomb mesh shape having a pitch of 200 μm.

Further, the sheet resistance of the transparent conductive laminate manufactured in Example 2 was 5 $\Omega$/sq to 7 $\Omega$/sq. Therefore, it was verified that the sheet resistance was 5% to 7% of the sheet resistance of the glass substrate formed of only ITO manufactured in Comparative Example 2.

Example 3

A PH-1000-based coating solution of Heraus corporation as PEDOT:PSS was spin-coated on the transparent conductive laminate manufactured in Example 2 at a speed of 500 rpm for 30 seconds and then heat-treated at a temperature of 230° C. for 30 minutes to form the transparent conductive layer.

The sheet resistance of the transparent conductive laminate manufactured in Example 3 was 10 Ω/sq to 11 Ω/sq.

Figure 8:
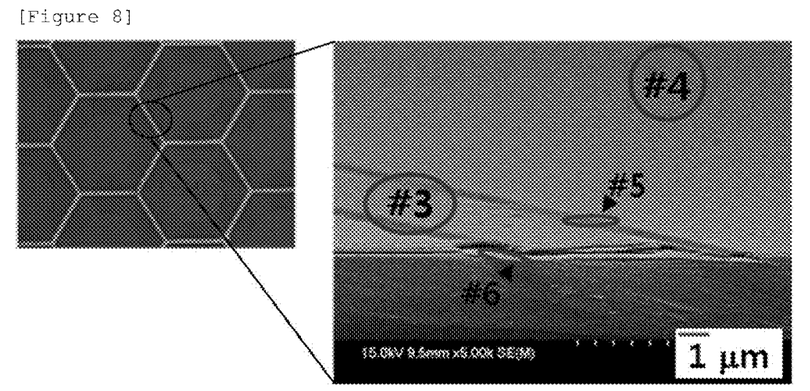
FIG. 8 illustrates a photograph of a transparent conductive laminate according to Example 3.

FIG. 8 illustrates a photograph of a transparent conductive laminate according to Example 3. In Example 3, since the transparent conductive layer was transparent, the transparent conductive layer was not shown on a photograph of FIG. 8.

Figure 9:
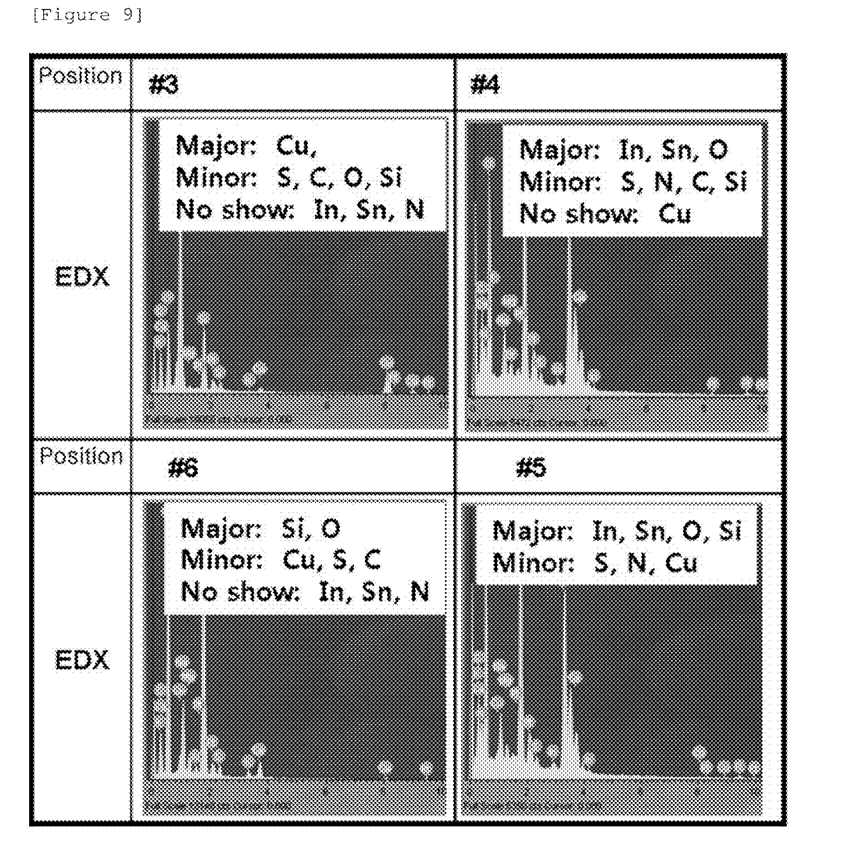
FIG. 9 illustrates measuring elements according to an area of FIG. 8.

Furthermore, a result of measuring elements according to an area displayed in FIG. 8 was illustrated in FIG. 9. #3 of FIGS. 8 and 9 is an area where the transparent conductive layer of PEDOT:PSS is provided on a copper conductive line, #4 is an area where the transparent conductive layer of PEDOT:PSS is provided on a transparent conductive pattern of ITO, #5 is a boundary between the conductive line and the conductive pattern, and #6 is an area where the conductive line is not perfectly formed.

In detail, in FIGS. 8 and 9, #3 means that the ITO forming the transparent conductive layer is not detected at a position where the conductive line is formed, and #4 means that Cu forming the conductive line is not detected in an area where the transparent conductive pattern is provided. #5 means that a gap may be filled by PEDOT:PSS as the transparent conductive layer, when a gap is present between the conductive line and the conductive pattern. Further, #6 may see that ITO forming the transparent conductive pattern is not present in an area where the conductive line is formed, as a scratch area where the conductive line is not normally formed.

Comparative Example 3

A transparent conductive layer was formed on a glass substrate under the same condition as Example 3 to form a transparent conductive laminate. In this case, a sheet resistance was 2,100 Ω/sq.

EXPLANATION OF SYMBOLS

101: transparent substrate
201: transparent conductive patterns
301: conductive line
401: transparent conductive layer (second transparent conductive layer)
501: first transparent conductive layer
601: conductive layer for forming conductive line
701: sacrificial layer

What is claimed is:

1. A transparent conductive laminate, comprising:
   a transparent substrate; two or more transparent conductive patterns provided on the transparent substrate; and
   a conductive line having higher electrical conductivity than the transparent conductive patterns,
   wherein the conductive line and the transparent conductive patterns are provided on a same surface of the transparent substrate, and the conductive line is provided between at least two adjacent transparent conductive patterns to contact at least a part of the transparent conductive patterns; and
   a transparent conductive layer provided on an upper surface of the transparent conductive patterns and the conductive line, wherein at least two transparent conductive patterns are separated from each other, and electrically connected to each other by the conductive line.

2. The transparent conductive laminate of claim 1, wherein the conductive line is provided between the transparent conductive patterns to contact the transparent conductive patterns.

3. The transparent conductive laminate of claim 1, wherein an upper surface step of the transparent conductive patterns and the conductive line which face a lower surface adjacent to the transparent substrate is 0 nm or more and 30 nm or less.

4. The transparent conductive laminate of claim 1, wherein a thickness of the transparent conductive patterns is 15 nm or more and 200 nm or less.

5. The transparent conductive laminate of claim 1, wherein a line width of the conductive line is 2 µm or more and 70 µm or less.

6. The transparent conductive laminate of claim 4, wherein the thickness of the transparent conductive patterns is 50 nm or more and 180 nm or less.

7. The transparent conductive laminate of claim 1, wherein a shape of the transparent conductive patterns is a triangle, a quadrangle, a honeycomb shape, or a Voronoi polygon.

8. The transparent conductive laminate of claim 1, wherein a pitch of the transparent conductive patterns is 100 µm or more and 600 µm or less.

9. The transparent conductive laminate of claim 1, wherein the transparent conductive patterns include a metal oxide or a transparent conductive polymer.

10. The transparent conductive laminate of claim 1, wherein a sheet resistance of the transparent conductive laminate is 70% or less of the sheet resistance of the transparent conductive patterns.

11. The transparent conductive laminate of claim 1, wherein an aperture ratio of the transparent conductive laminate is 80% or more and 99% or less.

12. The transparent conductive laminate of claim 1, wherein transmittance for visible light of the transparent conductive laminate is 60% or more and 93% or less.

13. A transparent electrode including the transparent conductive laminate of claim 1.

14. An organic electronic device including the transparent electrode of claim 13.

15. A manufacturing method of the transparent conductive laminate of claim 1, comprising:
   preparing the transparent substrate;
   forming a first transparent conductive layer on the transparent substrate;
   forming two or more transparent conductive patterns by patterning the first transparent conductive layer; and
   forming the conductive line between at least two adjacent transparent conductive patterns so that at least a part of the conductive line contacts the transparent conductive patterns; and
   forming a second transparent conductive layer provided on the upper surface of the transparent conductive patterns and the conductive line.

16. The method of claim 15, wherein the forming of the conductive line includes forming a conductive layer for forming the conductive line on the transparent substrate and the transparent conductive pattern, and removing the conductive layer formed on the transparent conductive patterns, after the patterning.

17. The method of claim 16, wherein the conductive layer is formed with a thickness of 0 nm or more and 30 nm or less which is different from a thickness of the transparent conductive patterns.

18. The method of claim 15, further comprising:
   forming a sacrificial layer on the first transparent conductive layer;
   patterning simultaneously or respectively the first transparent conductive layer and the sacrificial layer; and removing the sacrificial layer, after forming the conductive line.

\* \* \* \* \*